(12) United States Patent
Kim et al.

(10) Patent No.: US 9,153,797 B2
(45) Date of Patent: Oct. 6, 2015

(54) LARGE AREA ORGANIC LIGHT EMITTING DIODE DISPLAY AND METHOD FOR MANUFACTURING THE SAME

(71) Applicant: LG Display Co., Ltd., Seoul (KR)

(72) Inventors: Youngmi Kim, Incheon (KR); Joonyoung Heo, Seoul (KR); Yeonkyeong Lee, Seoul (KR); Yongmin Park, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/701,247

(22) Filed: Apr. 30, 2015

(65) Prior Publication Data

US 2015/0236308 A1    Aug. 20, 2015

Related U.S. Application Data

(62) Division of application No. 13/903,176, filed on May 28, 2013, now Pat. No. 9,054,341.

(30) Foreign Application Priority Data

Dec. 21, 2012  (KR) .......................... 10-2012-0151437

(51) Int. Cl.
  *H01L 51/56*  (2006.01)
  *H01L 51/52*  (2006.01)
  H01L 51/50  (2006.01)

(52) U.S. Cl.
  CPC ................ *H01L 51/56* (2013.01); *H01L 51/52* (2013.01); *H01L 51/5012* (2013.01); *H01L 51/5072* (2013.01); *H01L 51/5088* (2013.01)

(58) Field of Classification Search
  CPC ... H01L 29/08; H01L 27/3209; H01L 27/322; H01L 1151/0011; H01L 51/5036; H01L 27/3267; H01L 51/5206; H01L 51/5265; H01L 31/113; H01L 27/153; H01L 27/3211; H01L 33/08; H01L 33/58; H01L 51/05; H01L 51/30
  USPC .......................................................... 438/34
  See application file for complete search history.

(56) References Cited

U.S. PATENT DOCUMENTS

2007/0075312 A1    4/2007  Chin et al.
2014/0061595 A1*   3/2014  Kim et al. ........................ 257/40

OTHER PUBLICATIONS

United States Office Action, U.S. Appl. No. 13/903,176, Dec. 5, 2014, 9 pages.

* cited by examiner

*Primary Examiner* — Selim Ahmed
(74) *Attorney, Agent, or Firm* — Fenwick & West LLP

(57) ABSTRACT

The present disclosure relates to a large area organic light emitting diode display and a method for manufacturing the same. A photoresist is deposited across first and second pixel areas of the display. The photoresist is patterned to generate a patterned photoresist by stripping away first portions of the photoresist in the first pixel areas while keeping second portions of the photoresist in the second pixel areas. An organic emission layer is deposited across the first and second pixel areas over the patterned photoresist. An electron transport layer is deposited across the first pixel areas and the second pixel areas over the organic emission layer. Portions of the organic emission layer and the electron transport layer in the second pixel areas are removed by stripping away the second portions of the photoresist while keeping portions of the organic emission layer and the electron transport layer in the first pixel areas.

10 Claims, 9 Drawing Sheets

Related Art

LARGE AREA ORGANIC LIGHT EMITTING DIODE DISPLAY AND METHOD FOR MANUFACTURING THE SAME

CROSS-REFERENCE TO RELATED APPLICATIONS

This application is a divisional of U.S. patent application Ser. No. 13/903,176 filed on May 28, 2013, which claims the benefit of Korea Patent Application No. 10-2012-0151437 filed on Dec. 21, 2012, both of which are incorporated herein by reference for all purposes as if fully set forth herein.

BACKGROUND

1. Field of the Invention

The present disclosure relates to a large area organic light emitting diode display and a method for manufacturing the same. Especially, the present disclosure relates to a large area organic light emitting diode display having color light emitting diode in each pixel and a method for manufacturing the same with a photo lithography process.

2. Discussion of the Related Art

Nowadays, various flat panel display devices are developed for overcoming many drawbacks of the cathode ray tube such as heavy weight and bulk volume. The flat panel display devices include the liquid crystal display device (or LCD), the field emission display (or FED), the plasma display panel (or PDP) and the electroluminescence device (or EL).

The electroluminescence display device is categorized in the inorganic light emitting diode display device and the organic light emitting diode display device according to the luminescence material. As a self-emitting display device, the electroluminescence display device has the merits that the response speed is very fast, the brightness is very high and the viewing angle is large.

Figure 1:
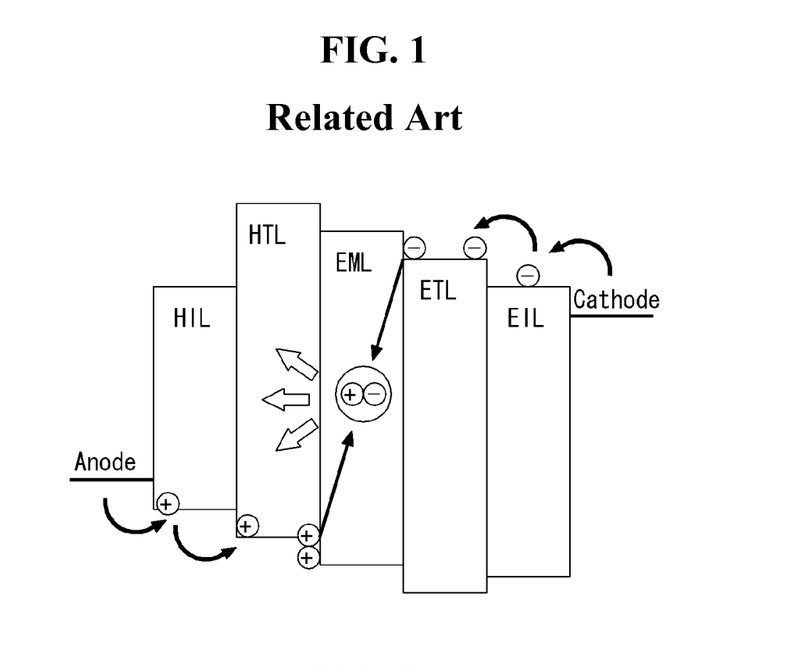
FIG. 1 is a diagram illustrating the structure of the organic light emitting diode according to the related art.

FIG. 1 is a diagram illustrating the structure of the organic light emitting diode. As shown in FIG. 1, the organic light emitting diode comprises the organic light emitting material layer, and the cathode and the anode which are facing each other with the organic light emitting material layer therebetween. The organic light emitting material layer comprises the hole injection layer HIL, the hole transport layer HTL, the emission layer EML, the electron transport layer ETL and the electron injection layer EIL. The organic light emitting diode emits light due to the energy from the exciton formed at the excitation state in which the hole and the electron are recombined at the emission layer EML.

The organic light emitting diode emits light due to the energy from the exciton formed at the excitation state in which the hole from the anode and the electron from the cathode are recombined at the emission layer EML. The organic light emitting diode display can represent the video data by controlling the amount (or 'brightness') of the light generated and radiated from the emission layer ELM of the organic light emitting diode as shown in FIG. 1.

The organic light emitting diode display (or OLED) using the organic light emitting diode can be categorized in the passive matrix type organic light emitting diode display (or PMOLED) and the active matrix type organic light emitting diode display (or AMOLED).

The active matrix type organic light emitting diode display (or AMOLED) shows the video data by controlling the current applying to the organic light emitting diode using the thin film transistor (or TFT).

Figure 2:
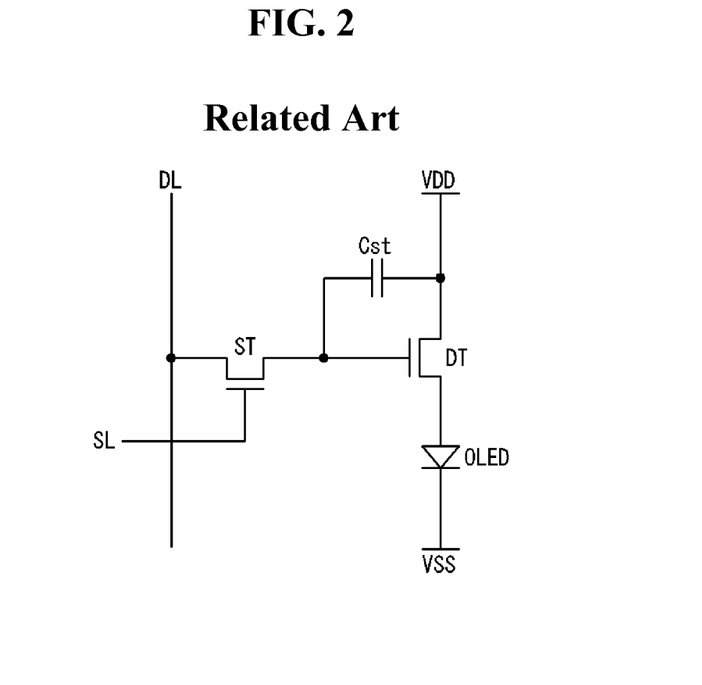
FIG. 2 is the exemplary circuit diagram illustrating the structure of one pixel in the active matrix organic light emitting diode display (or AMOLED) according to the related art.
Figure 3:
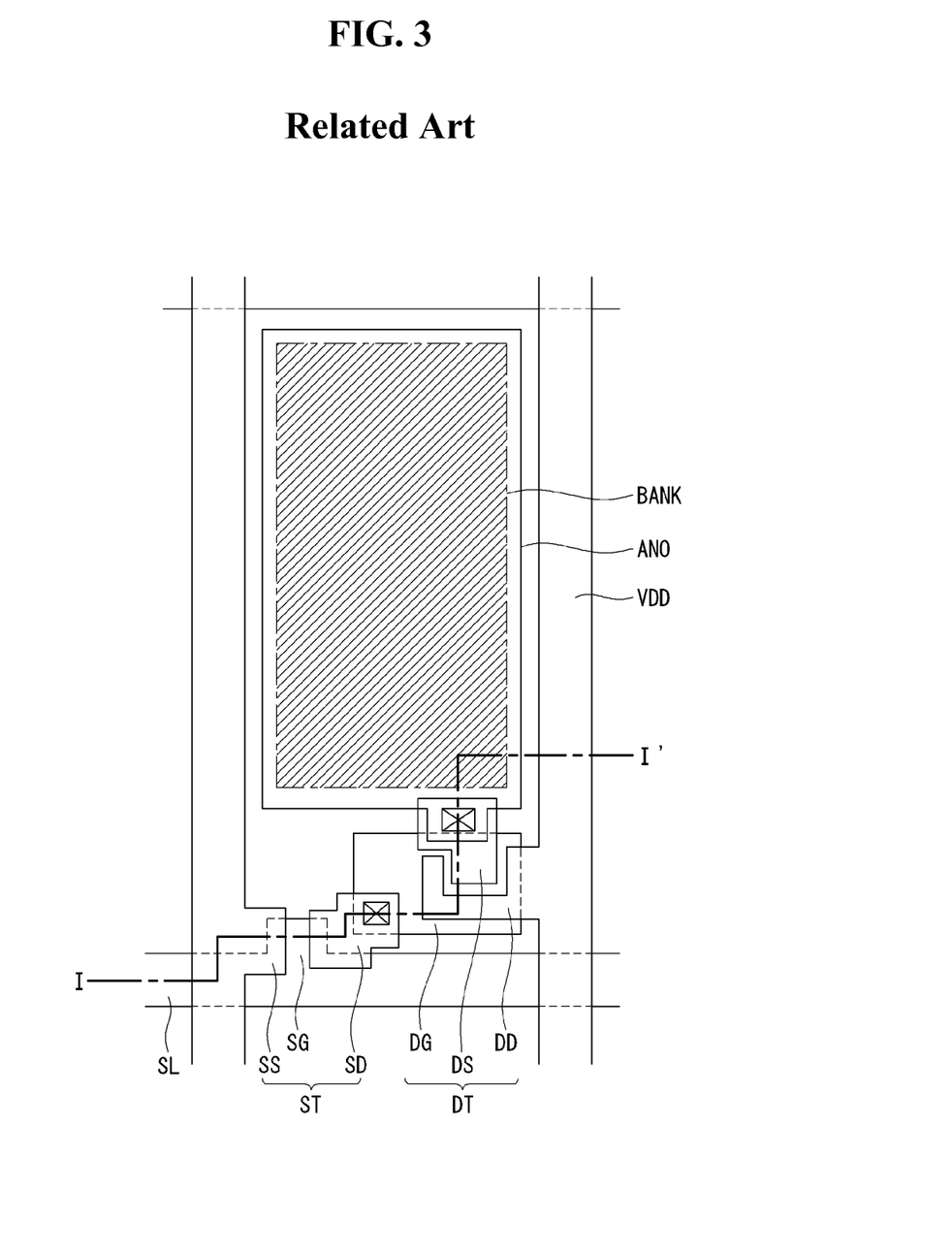
FIG. 3 is a plane view illustrating the structure of one pixel in the AMOLED according to the related art.
Figure 4:
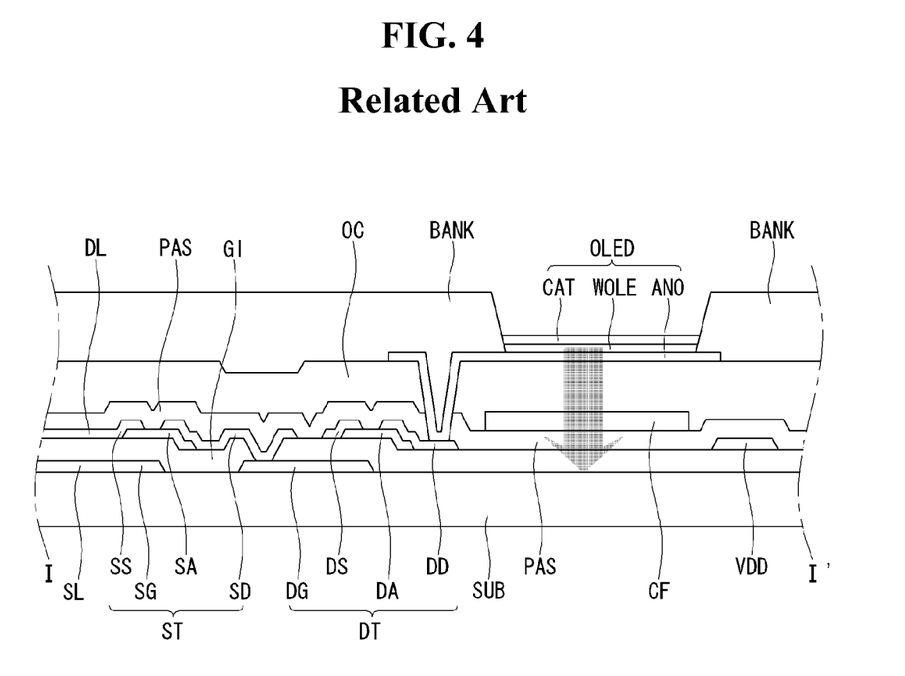
FIG. 4 is a cross sectional view along the cutting line I-I' for illustrating the structure of the AMOLED according to the related art.

FIG. 2 is the exemplary circuit diagram illustrating the structure of one pixel in the active matrix organic light emitting diode display (or AMOLED). FIG. 3 is a plane view illustrating the structure of one pixel in the AMOLED. FIG. 4 is a cross sectional view along the cutting line I-I' for illustrating the structure of the AMOLED.

Referring to FIGS. 2, 3 and 4, the active matrix organic light emitting diode display comprises a switching thin film transistor ST, a driving thin film transistor DT connected to the switching thin film transistor ST, and an organic light emitting diode OLED connected to the driving thin film transistor DT. By a scan line SL, a data line DL and a driving current line VDD disposed on a substrate SUB, a pixel area is defined. The organic light emitting diode OLED is formed in one pixel area and defines a light emitting area within the pixel area.

The switching thin film transistor ST is formed where the scan line SL and the data line DL cross. The switching thin film transistor ST acts for selecting the pixel which is connected to the switching thin film transistor ST. The switching thin film transistor ST includes a gate electrode SG branching from the scan line SL, a semiconductor channel layer SA overlapping with the gate electrode SG, a source electrode SS and a drain electrode SD. The driving thin film transistor DT acts for driving an anode electrode ANO of the organic light emitting diode OLED disposed at the pixel selected by the switching thin film transistor ST. The driving thin film transistor DT includes a gate electrode DG connected to the drain electrode SD of the switching thin film transistor ST, a semiconductor channel layer DA, a source electrode DS connected to the driving current line VDD, and a drain electrode DD. The drain electrode DD of the driving thin film transistor DT is connected to the anode electrode ANO of the organic light emitting diode OLED. Between the anode electrode ANO and the cathode electrode CAT, the organic light emitting layer OLE is disposed. The cathode electrode CAT is connected to the base voltage VSS. Between the gate electrode DG of the driving thin film transistor DT and the driving current line VDD or between the gate electrode DG of the driving thin film transistor DT and the drain electrode DD of the driving thin film transistor DT, a storage capacitance Cst is formed.

Referring to FIG. 4 more detail, on the substrate SUB of the active matrix organic light emitting diode display, the gate electrodes SG and DG of the switching thin film transistor ST and the driving thin film transistor DT, respectively are formed. On the gate electrodes SG and DG, the gate insulator GI is deposited. On the gate insulator GI overlapping with the gate electrodes SG and DG, the semiconductor layers SA and DA are formed, respectively. On the semiconductor layer SA and DA, the source electrode SS and DS and the drain electrode SD and DD facing and separating from each other are formed. The drain electrode SD of the switching thin film transistor ST is connected to the gate electrode DG of the driving thin film transistor DT via the contact hole penetrating the gate insulator GI. The passivation layer PAS is deposited on the substrate SUB having the switching thin film transistor ST and the driving thin film transistor DT.

The upper surface of the substrate having these thin film transistors ST and DT is not in even and/or smooth conditions, but in uneven and/or rugged conditions having many steps. In order for the organic light emitting diode display to have good luminescent quality over the whole display area, the organic light emitting layer OLE should be formed on an even or smooth surface. So, to make the upper surface in planar and even conditions, the over coat layer OC is deposited on the whole surface of the substrate OC.

Then, on the over coat layer OC, the anode electrode ANO of the organic light emitting diode OLED is formed. Here, the anode electrode ANO is connected to the drain electrode DD of the driving thin film transistor DT through the contact hole penetrating the over coat layer OC and the passivation layer PAS.

On the substrate SUB having the anode electrode ANO, a bank BANK is formed over the area having the switching thin film transistor ST, the driving thin film transistor DT and the various lines DL, SL and VDD, for defining the light emitting area. The exposed portion of the anode electrode ANO by the bank BANK would be the light emitting area. On the anode electrode ANO exposed from the bank BANK, the organic light emitting layer OLE is formed. On the organic light emitting layer OLE, the cathode electrode ACT is formed.

For the case of the bottom emission type full color organic light emitting diode display, a color filter CF may be further comprised between the over coat layer OC and the passivation layer PAS, and the anode electrode ANO may include the transparent conductive material. For this case, the organic light emitting layer OLE may have the white light emitting organic material. And, the organic light emitting layer OLE and the cathode electrode CAT may be deposited as covering the whole surface of the substrate SUB.

On the other hand, for the case of the top emission type full color organic light emitting diode display, the anode electrode ANO may be made of a reflective electrode. The organic light emitting layer OLE may have the organic material radiating any one color light of red, green and blue color. The cathode electrode CAT may be deposited as covering the whole surface of the substrate SUB. For other example, the organic light emitting layer OLE may have the white light emitting organic material. In this case, the organic light emitting layer OLE and the cathode electrode CAT may be deposited as covering the whole surface of the substrate SUB. And, on the organic light emitting layer OLE or the cathode electrode CAT, the color filter CF may be formed.

As the organic light emitting diode display is one of the self-luminescence device, the back light unit used for the liquid crystal display is not required. Therefore, the organic light emitting diode display is more preferable to develop a thin flat type display. Furthermore, as it has the low light energy loss, it is easy to develop brighter display with lower power consumption. With many merits, the organic light emitting diode display would be the best solution for the next generation display. However, the mass manufacturing method for large area display having the 20 inch or more diagonal area such as TV monitor has not been developed. Until now, the organic light emitting diode display is applied to the small display having at most 15 inch or less diagonal display area.

In order to manufacture a full color organic light emitting diode display, it is important to form an organic light emitting layer having any one color of red, green and blue colors at each pixel area, selectively. However, it is very hard to pattern the organic light emitting material by the currently used photo lithography method, while ensuring a stable and reliable pattern quality. One possible method has been suggested in which the organic light emitting material is selectively deposited on the large area substrate using a fine patterned screen mask.

When the display size of the organic light emitting diode display is less than 15 inch diagonal area, the organic light emitting layer OLE can be selectively formed on the anode electrode ANO. For example, with a simple process using a screen mask, the organic light emitting layer OLE can be formed within a pre-determined area. However, when the display size is larger than 20 inches, it is almost impossible to form the organic light emitting layer within specified areas over a large area using the screen mask process. This is because as the size of the display area increases, the size and weight of the screen mask also increases. The additional size and weight of the screen mask causes the screen mask to sag in the middle so that it becomes non-planar. As a result, it is hard to deposit the organic light emitting material with uniform thickness over the large area substrate with a screen mask. Consequently, a new method for manufacturing a large area organic light emitting diode display with organic light emitting materials radiating red, green and blue light colors respectively is required.

Furthermore, in order to accomplish a mass production method for manufacturing the large area organic light emitting diode display, there are many problems to be overcome.

SUMMARY OF THE INVENTION

In order to overcome the above mentioned drawbacks, the purpose of the present disclosure is to suggest a large area organic light emitting diode display and a method for manufacturing the same. Another purpose of the present disclosure is to suggest a method for manufacturing a large area organic light emitting diode display using the photo lithography process without any damages on the organic light emitting layer and a large area organic light emitting diode display using the same method.

In one embodiment, disclosed is a method for manufacturing an organic light emitting diode display having a matrix of pixel areas that includes at least first pixel areas and second pixel areas. A photoresist is deposited across the first pixel areas and the second pixel areas. The photoresist is patterned into a patterned photoresist by stripping away first portions of the photoresist in the first pixel areas while keeping second portions of the photoresist in the second pixel areas. An organic emission layer is deposited across the first pixel areas and the second pixel areas, wherein the organic emission layer is deposited over the patterned photoresist in the second pixel areas. An electron transport layer is deposited across the first pixel areas and the second pixel areas over the organic emission layer. Portions of the organic emission layer and the electron transport layer in the second pixel areas are removed by stripping away the second portions of the photoresist while keeping portions of the organic emission layer and the electron transport layer in the first pixel areas.

In one embodiment of the method, a cathode layer is deposited across the first pixel areas and the second pixel areas over the organic emission layer. Portions of the cathode layer in the second pixel areas are removed by stripping away the second portions of the photoresist while keeping portions of the cathode layer in the first pixel areas.

In one embodiment of the method, after removing portions of the organic emission layer and the electron transport layer, a common electron transport layer is deposited across the first pixel areas and the second pixel areas.

In one embodiment of the method, anode electrodes are formed in the first pixel areas and the second pixel areas, and the photoresist is deposited over the anode electrodes.

In one embodiment of the method, a common hole injection layer is deposited across the first pixel areas and the second pixel areas, a common hole transport layer is deposited across the first pixel areas and the second pixel areas over the common hole injection layer, and the photoresist is deposited over the common hole transport layer.

In one embodiment of the method, after removing portions of the organic emission layer and the electron transport layer, a common cathode layer is deposited across the first pixel areas and the second pixel areas.

In one embodiment of the method, the first pixel areas correspond to a first light color and the second pixel areas correspond to one or more second light colors that are different than the first light color. In one embodiment, depositing the organic emission layer comprises depositing one of a red organic emission layer, a green organic emission layer, or a blue organic emission layer.

In one embodiment of the method, depositing the photoresist comprises depositing a fluorinated photoresist that is subject to photodimerization.

In one embodiment of the method, the patterned photoresist has a reverse tapered shape along edges of the first pixel areas.

In one embodiment, disclosed is an organic light emitting diode display comprises a matrix of pixel areas that includes at least a first pixel area and a second pixel area. A first anode is formed within the first pixel area. A second anode is formed within the second pixel area, wherein the second anode is separate from the first anode. A common hole injection layer is formed over the first anode and the second anode across the first pixel area and the second pixel area. A first organic emission layer is formed within the first pixel area over the common hole injection layer. A second organic emission layer is formed within the second pixel area over the common hole injection layer, wherein the second organic emission layer is separate from the first organic emission layer.

In one embodiment of the display device, the display device comprises a common hole transport layer is formed over the common hole injection layer across the first pixel area and the second pixel area, wherein the first organic emission layer and the second organic emission layer are formed over the common hole transport layer.

In one embodiment of the display device, the display device comprises a first electron transport layer formed over the first organic emission layer within the first pixel area, and a second electron transport layer formed over the second organic emission layer within the second pixel area, the second electron transport layer being separate from the first electron transport layer. A common electron transport layer is formed over the first electron transport layer and the second electron transport layer across the first pixel area and the second pixel area.

In one embodiment of the display device, the display device comprises a first cathode layer formed over the first organic emission layer within the first pixel area, and a second cathode layer formed over the second organic emission layer within the second pixel area, the second cathode layer being separate from the first cathode layer. A common cathode layer is formed over the first cathode layer and the second cathode layer across the first pixel area and the second pixel area.

In one embodiment of the display device, the first organic emission layer is adapted to emit a first light color and the second organic emission layer is adapted to emit a second light color that is different than the first light color.

In one embodiment of the display device, the pixel areas also include a third pixel area. A third anode is formed within the third pixel area, wherein the third anode is separate from the first anode and the second anode, and wherein the common hole injection layer is formed over the first anode, the second anode, and the third anode across the first pixel area, the second pixel area, and the third pixel area. A third organic emission layer is formed within the third pixel area over the common hole injection layer, wherein the third organic emission layer is separate from the first organic emission layer and the second organic emission layer. The third organic emission layer is adapted to emit a third light color that is different than the first light color and the second light color. In one embodiment, the first light color is red, the second light color is green, and the third light color is blue.

The present disclosure suggests a large area organic light emitting diode display which can represent full color without the color filter by patterning the organic color light emitting material, and a method for manufacturing the same. In one embodiment, by patterning the organic light emitting layer and the electron transport layer at the same time, the organic light emitting layer can be patterned in stable state over the large area. Furthermore, by the photo lithography process according to the present disclosure, it is possible to manufacture a high resolution large area organic light emitting diode display having the red, green and blue pixels with reliable and stable production yield.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION

Referring to attached figures, we will explain preferred embodiments of the present disclosure. Like reference numerals designate like elements throughout the detailed description. However, the present disclosure is not restricted by these embodiments but can be applied to various changes or modifications without changing the technical spirit. In the following embodiments, the names of the elements are selected by considering the easiness for explanation so that they may be different from actual names.

In the present disclosure when a structure is described as being on or over another structure, this includes situations where the structures contact each other as well as situations where an intervening structure is disposed therebetween. However, when the term "directly on" or "directly over" is used, it includes only situations where the structures contact each other.

Figure 5:
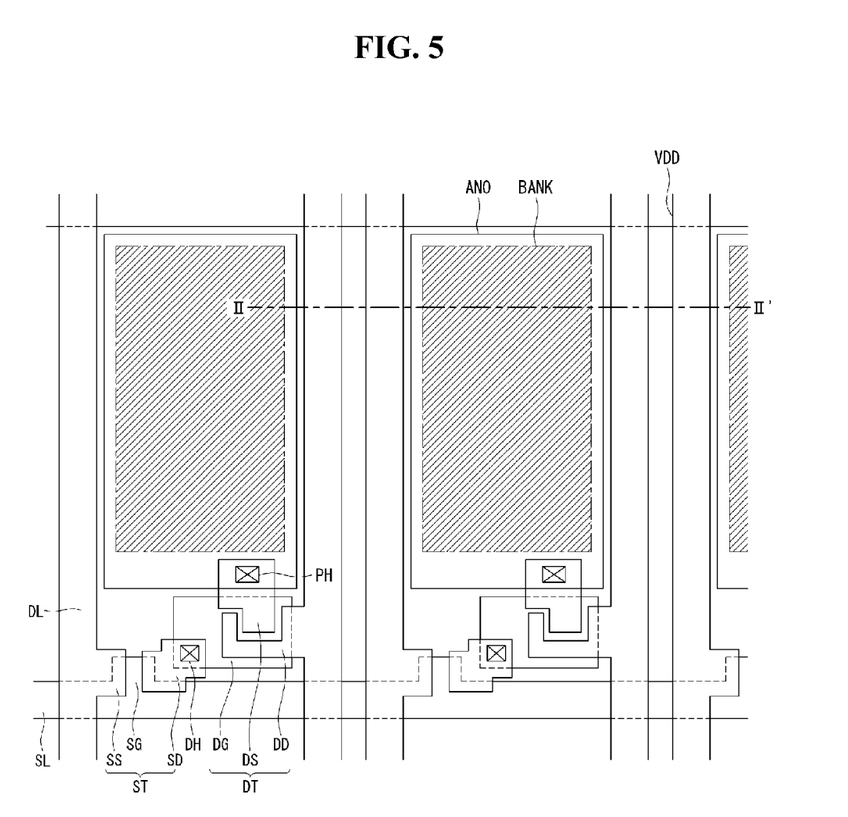
FIG. 5 is a plane view illustrating the structure of a large area organic light emitting diode display according to the present disclosure.
Figure 6:
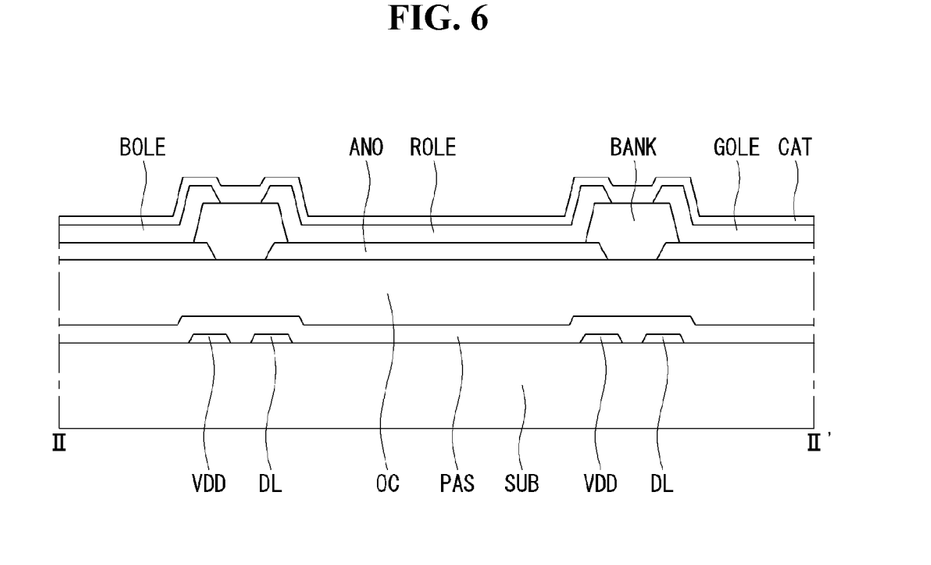
FIG. 6 is a cross sectional view along the cutting line of II-II' in FIG. 5 for illustrating the structure of a large area organic light emitting diode display according to the present disclosure.

Hereinafter, referring to FIGS. 5 and 6, we will explain a large area organic light emitting diode display according to the present disclosure. FIG. 5 is a plane view illustrating the structure of a large area organic light emitting diode display according to the present disclosure. FIG. 6 is a cross sectional view along line II-II' in FIG. 5 for illustrating the structure of a large area organic light emitting diode display according to the present disclosure.

Referring to FIG. 5, a large area organic light emitting diode display comprises a switching thin film transistor ST, a driving thin film transistor DT connected to the switching thin film transistor ST, and an organic light emitting diode OLED connected to the driving thin film transistor DT. By a scan line SL, a data line DL and a driving current line VDD disposed on a substrate SUB (not shown), a pixel area is defined. The organic light emitting diode OLED (not shown) is formed in one pixel area and defines a light emitting area within the pixel area.

The switching thin film transistor ST is formed where the scan line SL and the data line DL cross. The switching thin film transistor ST selects the pixel which is connected to the switching thin film transistor ST. The switching thin film transistor ST includes a gate electrode SG branching from the select line SL, a semiconductor channel layer SA (not shown) overlapping with the gate electrode SG, a source electrode SS and a drain electrode SD. The driving thin film transistor DT drives an anode electrode ANO of the organic light emitting diode OLED disposed at the pixel selected by the switching thin film transistor ST. The driving thin film transistor DT includes a gate electrode DG connected to the drain electrode SD of the switching thin film transistor ST, a semiconductor channel layer DA (not shown), a source electrode DS connected to the driving current line VDD, and a drain electrode DD. The drain electrode DD of the driving thin film transistor DT is connected to the anode electrode ANO of the organic light emitting diode OLED. Between the anode electrode ANO and the cathode electrode CAT (not shown), the organic light emitting layer OLE is disposed. The cathode electrode CAT is connected to the base voltage VSS (not shown). Between the gate electrode DG of the driving thin film transistor DT and the driving current line VDD or between the gate electrode DG of the driving thin film transistor DT and the drain electrode DD of the driving thin film transistor DT, a storage capacitance Cst (not shown) is formed.

More detail of the organic light emitting diode display will be explained by reference to FIG. 6. In the present disclosure, the structure of the thin film transistor ST and DT is similar with that of the related art and the following description may refer to FIG. 4 for the structure of the thin film transistor. However, the structure of the organic light emitting diode OLED is significantly different and will explained by reference to FIG. 6.

On a large area substrate SUB, the gate electrodes SG and DG of the switching thin film transistor ST and the driving thin film transistor DT, respectively are formed. For the case of the top emission type display, the substrate SUB may be an opaque. For the case of the bottom emission type or the both emission type display, the substrate SUB would be transparent. On the gate electrodes SG and DG, the gate insulator GI is deposited. The semiconductor layers SA and DA are formed on some portions of the gate insulator GI overlapping with the gate electrodes SG and DG. On the semiconductor layers SA and DA, the source electrodes SS and DS and the drain electrodes SD and DD are facing each other respectively with certain distance. The drain electrode SD of the switching thin film transistor ST is connected to the gate electrode DG of the driving thin film transistor DT via the contact hole penetrating the gate insulator GI. The passivation layer PAS is deposited on the substrate SUB having the switching thin film transistor ST and the driving thin film transistor DT.

The upper surface of the substrate having these thin film transistors ST and DT is not in even and/or smooth conditions, but in uneven and/or rugged conditions having many steps. In order for the organic light emitting diode display to have good luminescent quality over the whole display area, the organic light emitting layer OLE should be formed on an even or smooth surface. So, to make the upper surface in planar and even conditions, the over coat layer OC is deposited on the whole surface of the substrate OC.

Then, on the over coat layer OC, the anode electrode ANO of the organic light emitting diode OLED is formed. Here, the anode electrode ANO is connected to the drain electrode DD of the driving thin film transistor DT through the contact hole penetrating the over coat layer OC and the passivation layer PAS. Each anode electrode ANO is formed within its own respective pixel area and is separate from the other anode electrodes ANO of the other pixel areas.

On the substrate SUB having the anode electrode ANO, a bank BANK is formed over the area having the switching thin film transistor ST, the driving thin film transistor DT and the various lines DL, SL and VDD, for defining the light emitting area. The exposed portion of the anode electrode ANO by the bank BANK would be the light emitting area. On the anode electrode ANO exposed from the bank BANK, the organic light emitting layer OLE is formed. On the organic light emitting layer OLE, the cathode electrode CAT is formed.

Especially, in the organic light emitting diode display according to the present disclosure, the organic light emitting layer OLE is individually patterned at the emitting area of the anode electrode ANO in each pixel area. For example, in order to represent full color, as shown in FIG. 6, any one pixel area has any one of the red organic light emitting layer ROLE, the green organic light emitting layer GOLE and the blue organic light emitting layer BOLE. According to the designed color pixel arraying style, the red organic light emitting layer ROLE, the green organic light emitting layer GOLE and the blue organic light emitting layer BOLE can be arrayed.

On the organic light emitting layer OLE, a cathode electrode CAT is formed. The cathode electrode CAT may be deposited on the whole surface of the substrate SUB as one common layer that is shared between pixel areas. Finally, the organic light emitting diode OLED including the anode electrode ANO connected to the drain electrode DD of the driving thin film transistor DT, the organic light emitting layer OLE and the cathode electrode CAT is completed.

In the present disclosure, as shown in FIG. 6, the organic light emitting layer OLE is patterned at each pixel area. Furthermore, the present disclosure suggests some preferred embodiments for patterning the organic light emitting layer OLE at each pixel area without any damages. According to the manufacturing method of the present disclosure, there are at least three embodiments for manufacturing the organic light emitting diode display.

Figure 7:
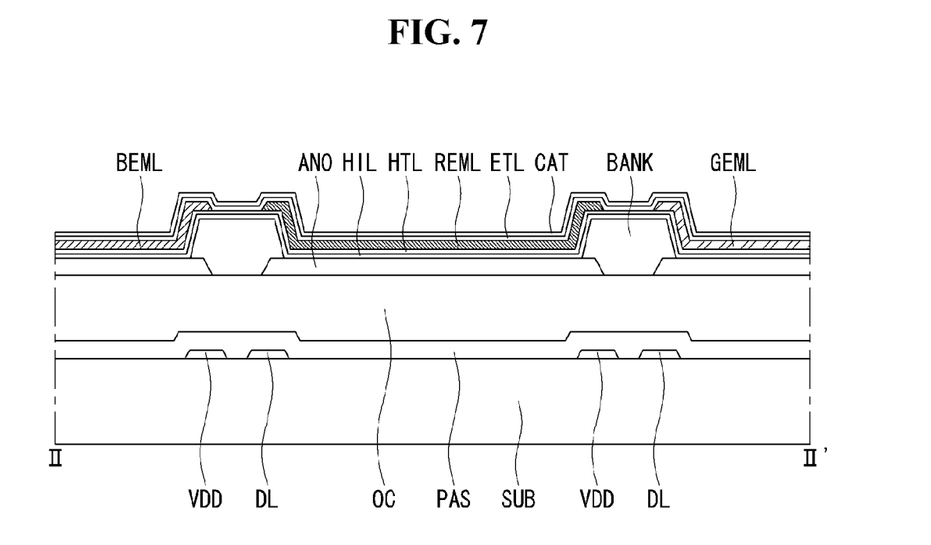
FIG. 7 is a cross sectional view illustrating the structure of a large area organic light emitting diode display according to the first embodiment of the present disclosure.
Figure 8:
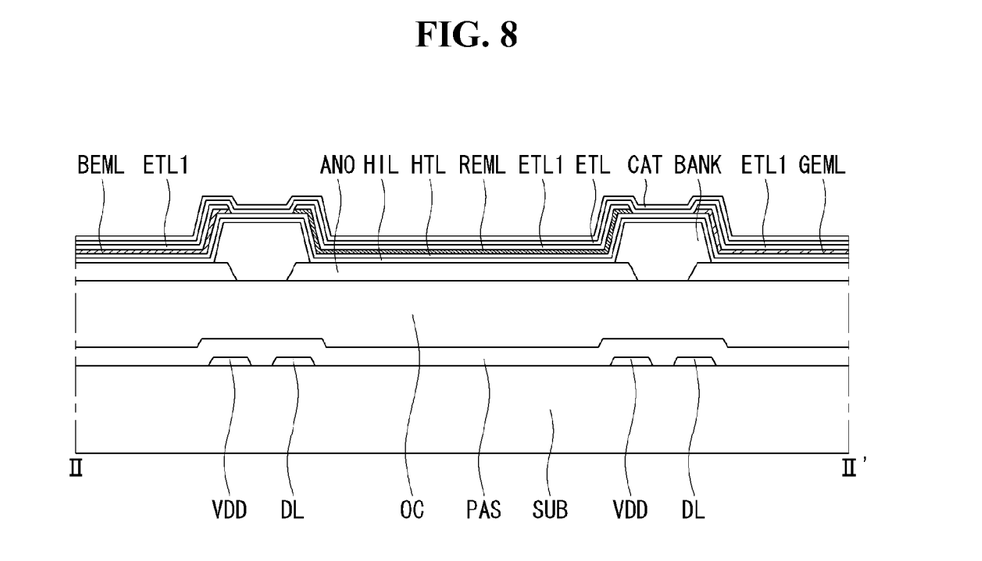
FIG. 8 is a cross sectional view illustrating the structure of a large area organic light emitting diode display according to the second embodiment of the present disclosure.
Figure 9:
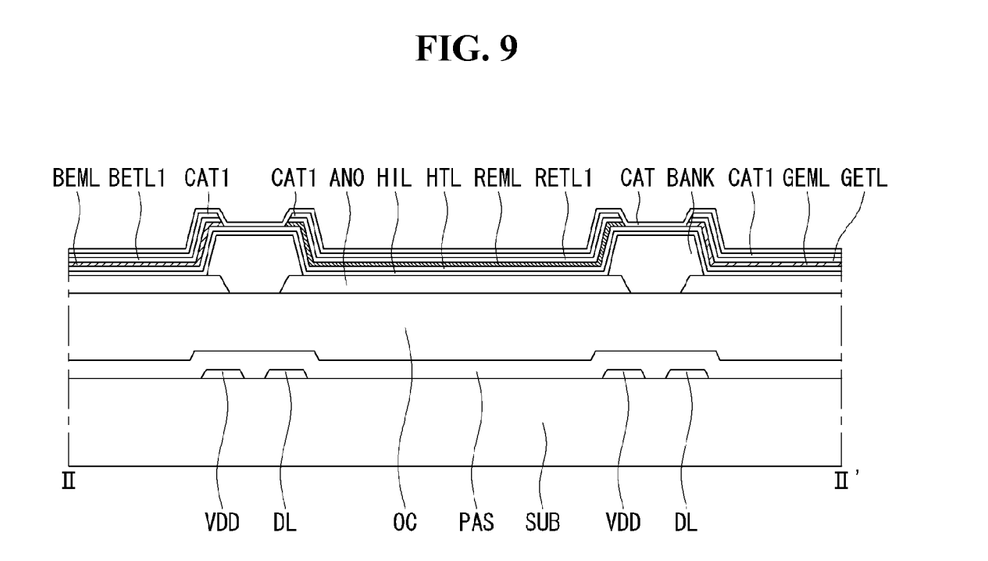
FIG. 9 is a cross sectional view illustrating the structure of a large area organic light emitting diode display according to the third embodiment of the present disclosure.

Hereinafter, referring to FIGS. 7 to 9, we will explain the preferred structures of the large area organic light emitting diode display according to the preferred embodiments of the present disclosure. FIG. 7 is a cross sectional view illustrating the structure of a large area organic light emitting diode display according to the first embodiment of the present disclosure. FIG. 8 is a cross sectional view illustrating the structure of a large area organic light emitting diode display according to the second embodiment of the present disclosure. FIG. 9 is a cross sectional view illustrating the structure of a large area organic light emitting diode display according to the third embodiment of the present disclosure. Here, we will explain by focusing on the structure of the organic light emitting diode, mainly.

Referring to FIG. 7, a hole injection layer HIL is deposited on the anode electrode ANO and the bank BANK, and covers the whole surface of the substrate SUB such that the hole injection layer HIL is commonly shared by multiple pixel areas . . . . A hole transport layer HTL is deposited on the hole injection layer HIL and covers the whole surface of the substrate SUB such that the hole transport layer HTL is commonly shared by multiple pixel areas. As the hole injection layer HIL and the hole transport layer HTL cover the whole surface of the substrate SUB, a photo mask process or screen mask process is not required.

In each pixel area, any one of the red organic emission layer REML, the green organic emission layer GEML and the blue organic emission layer BEML is formed between the banks BANK on the hole transport layer HTL. Additionally, the organic emission layers REML, GEML and BEML define their respective emitting areas and are separated from the other organic emission layers REML, GEML and BEML of other pixel areas. Therefore, it is preferred for the organic light emitting layers to cover the emitting area between adjacent banks BANK.

On the whole surface of the substrate SUB having the organic emission layers REML, GEML and BEML, an electron transport layer ETL and the cathode layer CAT are deposited, sequentially. The electron transport layer ETL and the cathode layer CAT are deposited across all of the pixel areas of the display and are commonly shared by all of the pixel areas. Here, even though it is not shown in figures, an electron injection layer EIL may be further disposed between the electron transport layer ETL and the cathode layer CAT.

Referring to FIG. 8, we will explain a large area organic light emitting diode display according to the second embodiment of the present disclosure. A hole injection layer HIL is deposited on the anode electrode ANO and the bank BANK, over the whole surface of the substrate SUB. A hole transport layer HTL is deposited on the hole injection layer HIL over the whole surface of the substrate SUB. As the hole injection layer HIL and the hole transport layer HTL cover the whole surface of the substrate SUB, a photo mask process or screen mask process is not required.

In each pixel area, any one of the red organic emission layer REML, the green organic emission layer GEML and the blue organic emission layer BEML is formed between the banks BANK on the hole transport layer HTL. Actually, the organic emission layers REML, GEML and BEML define their respective emitting areas. Therefore, it is preferred for the organic light emitting layers to cover the emitting area between adjacent banks BANK.

Furthermore, on each of the red organic emission layer REML, the green organic emission layer GEML and the blue organic emission layer BEML, a first electron transport layer ETL1 is formed separately. First electron transport layer ETL1 for each pixel area is thus distinct from and does not connect to the first electron transport layers ETL1 of other pixel areas. When the organic emission layers REML, GEML and BEML are patterned, the organic emission material may be damaged during the patterning process. By depositing the first electron transport layer ETL1 on the organic emission layers REML, GEML and BEML and then patterning them, the organic emission layers REML, GEML and BEML are less likely to be damaged by any materials used in the patterning process.

On the whole surface of the substrate SUB having the organic emission layers REML, GEML and BEML and the first electron transport layer ETL1 thereon patterned in each pixel area, an electron transport layer ETL and the cathode layer CAT are deposited, sequentially. Here, even though it is not shown in figures, an electron injection layer EIL may be further disposed between the electron transport layer ETL and the cathode layer CAT. Furthermore, not shown in figures either, the first electron transport layer ETL1 may be formed with enough thickness such that depositing a separate electron transport layer ETL is not necessary. In this case, the electron injection layer EIL can be disposed between the first electron transport layer ETL1 and the cathode electrode CAT.

Now, referring to FIG. 9, we will explain a large area organic light emitting diode display according to the third embodiment of the present disclosure. A hole injection layer HIL is deposited on the anode electrode ANO and the bank BANK, and covers the whole surface of the substrate SUB. On the hole injection layer HIL, a hole transport layer HTL is deposited covering the whole surface of the substrate SUB. As the hole injection layer HIL and the hole transport layer HTL cover the whole surface of the substrate SUB, a photo mask process or screen mask process is not required.

In each pixel area, any one of the red organic emission layer REML, the green organic emission layer GEML and the blue organic emission layer BEML is formed between the banks BANK on the hole transport layer HTL. Additionally, the emitting area is defined by the organic emission layers REML, GEML and BEML. Therefore, it is preferable for the organic light emitting layers to cover the emitting area between adjacent banks BANK.

Furthermore, on each of the red organic emission layer REML, the green organic emission layer GEML and the blue organic emission layer BEML, an electron transport layer ETL is formed separately. FIG. 9 illustrates that on the red organic emission layer REML there is a red electron transport layer RETL, on the green organic emission layer GEML there is a green electron transport layer GETL, and on the blue organic emission layer BEML there is a blue electron transport layer BETL. The electron transport layers do not have a particular color, but the electron transport layers are named using color symbols for convenience. Furthermore, on the electron transport layers RETL, GETL and BETL, first cathode electrodes CAT1 are formed separately and are distinct from the first cathode electrodes CAT1 of other pixel areas. The electron transport layers RETL, GETL and BETL and the first cathode electrodes CAT1 can prevent the organic emission layers REML, GEML and BEML from being damaged. That is, by depositing electron transport layers RETL, GETL and BETL and the first electron transport layers ETL1 on the organic emission layers REML, GEML and BEML and then patterning them, the organic emission layers REML, GEML and BEML are less likely to be damaged by any materials used in the patterning process.

On the whole surface of the substrate SUB having the organic emission layers REML, GEML and BEML, the electron transport layers RETL, GETL and BETL, and the first cathode electrode CAT1 thereon patterned in each pixel area, the cathode layer CAT is deposited. Here, even though it is not shown in figures, an electron injection layer EIL may be further disposed between the electron transport layers RETL, GETL and BETL and the first cathode layer CAT1. Furthermore, not shown in figures neither, the electron injection layer EIL may first be formed on each electron transport layers RETL, GETG and BETL, respectively, and then the cathode electrode CAT are deposited on the whole surface of the substrate SUB.

FIGS. 10A to 10F are cross sectional views illustrating a method for manufacturing the large area organic light emitting diode display according to the present disclosure. Hereinafter, referring to FIGS. 10A to 10F, we will explain a method for manufacturing a large area organic light emitting diode display according to the present disclosure. In the present disclosure, there are three preferred embodiments. However, these three embodiments are very similar. Therefore, we will explain the most complicated embodiment.

In the present disclosure, the process for manufacturing the thin film transistors ST and DT is the same with that of the related art. Therefore, the following description will focus on the process for manufacturing the organic light emitting diode having the main features of the present disclosure.

Figure 10A:
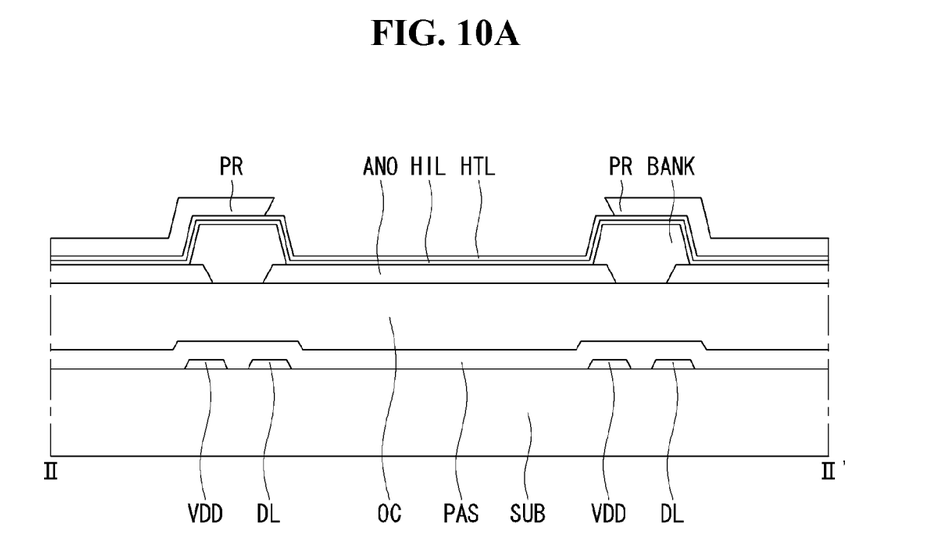
FIGS. 10A to 10F are cross sectional views illustrating a method for manufacturing the large area organic light emitting diode display according to the present disclosure.

After completing the thin film transistors ST and DT on a substrate SUB, an overcoat layer OC is deposited, a pixel contact hole PH (not shown) is formed, and an anode electrode ANO connected to the drain electrode DD of the driving thin film transistor DT is formed. After that, bank BANK is patterned for exposing the emitting area in each pixel areas. A hole injection layer HIL is deposited across the pixel areas on the whole surface of the surface SUB having the bank BANK. Sequentially, a hole transport layer HTL is deposited across the pixel areas on the whole surface of the hole injection layer HIL. After that, a photoresist PR is deposited across the pixel areas on the whole surface of the hole transport layer HTL. By patterning the photoresist PR with the photo mask process, only the portions of the photoresist PR over the emitting area of the red pixel area are removed. The other portions of the photoresist PR in the green and blue pixel areas are kept intact. The result is a patterned photoresist PR of FIG. 10A. Here, the patterned edge side of the photoresist PR would have the reversed tapered shape around the edges of the exposed pixel area, as shown in FIG. 10A.

Figure 10B:
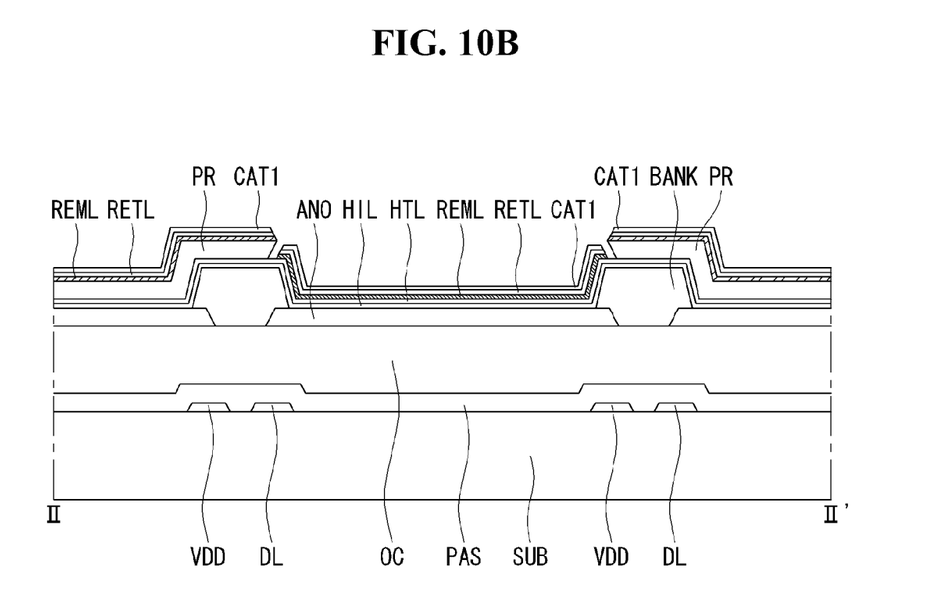

Referring to FIG. 10B, across the pixel areas on the whole surface of the substrate SUB having the patterned photoresist PR, a red organic emission layer REML, a red electron transport layer RETL, and a first cathode electrode CAT1 are sequentially deposited. As the edge side of the photoresist PR has the reversed tapered shape, the deposited three layers including the red organic emission layer REML, the red electron transport layer RETL, and the first cathode electrode CAT1 are deposited as being disconnected at the edge side of the photoresist PR, as shown in FIG. 10B.

Figure 10C:
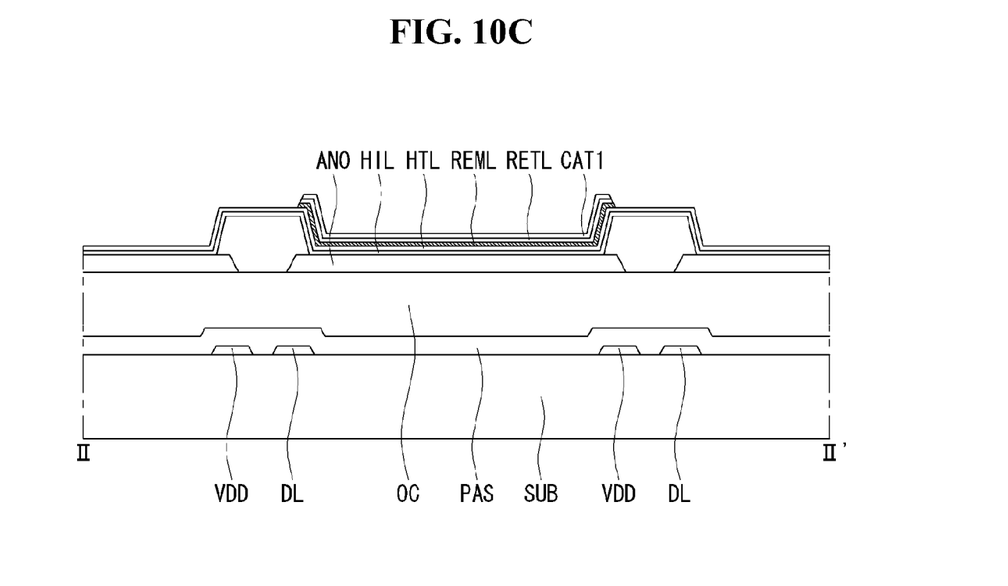

Using the lift-off method, the remaining portions of the photoresist PR are stripped and removed. As the photoresist PR is removed, the portions of the red organic emission layer REML, the red electron transport layer RETL, and the first cathode electrode CAT1 disposed on the photoresist PR are removed also. As a result, the red organic emission layer REML, the red electron transport layer RETL, and the first cathode electrode CAT1 are kept stacked just on the emitting area of the red pixel area, as shown in FIG. 10C.

Figure 10D:
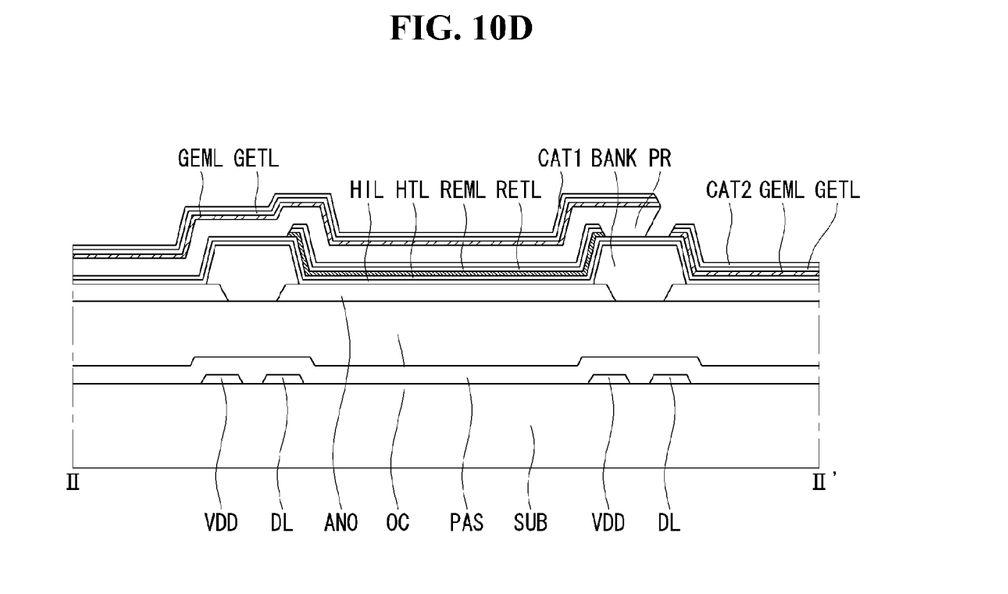

Referring to FIG. 10D, after completing the red pixels, the photoresist PR is deposited across the pixel areas on the whole surface of the substrate SUB. By patterning the photoresist PR with the photo mask process, only the portions of the photoresist PR over the emitting area of the green pixel area are removed. The other portions of the photoresist PR in the red and blue pixel areas are kept intact. Here, the patterned edge side of the photoresist PR would have the reversed tapered shape. Across all the pixel areas on the whole surface of the substrate SUB having the patterned photoresist PR, a green organic emission layer GEML, a green electron transport layer GETL, and a first cathode electrode CAT1 are sequentially deposited. As the edge side of the photoresist PR has the reversed tapered shape, the deposited three layers including the green organic emission layer GEML, the green electron transport layer GETL, and the first cathode electrode CAT1 are deposited as being disconnected at the edge side of the photoresist PR, as shown in FIG. 10D.

Using the lift-off method, the remaining portions of the photoresist PR are removed. As the photoresist PR is removed, the green organic emission layer GEML, the green electron transport layer GETL, and the first cathode electrode CAT1 disposed on the photoresist PR are removed also. As a result, the green organic emission layer GEML, the green electron transport layer GETL, and the first cathode electrode CAT1 are kept stacked just on the emitting area of the green pixel area.

Figure 10E:
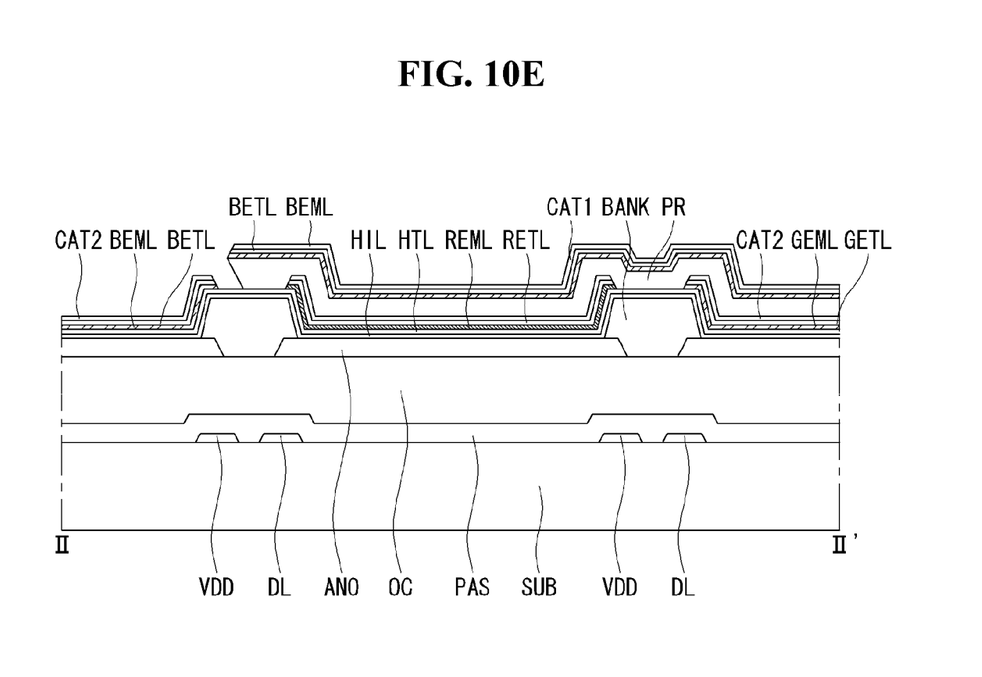

Now, the red pixel and the green pixel are completed. Referring to FIG. 10E, after that, the photoresist PR is again deposited across the pixel areas on the whole surface of the substrate SUB. By patterning the photoresist PR with the photo mask process, only the portions of the photoresist PR over the emitting area of the blue pixel area are removed. Portions of the photoresist PR over the red and green pixel areas are kept intact. With the same manner, the patterned edge side of the photoresist PR would have the reversed tapered shape. Across the pixel areas on the whole surface of the substrate SUB having the patterned photoresist PR, a blue organic emission layer BEML, a blue electron transport layer BETL, and a first cathode electrode CAT1 are sequentially deposited. As the edge side of the photoresist PR has the reversed tapered shape, the deposited three layers including the blue organic emission layer BEML, the blue electron transport layer BETL, and the first cathode electrode CAT1 are deposited as being disconnected at the edge side of the photoresist PR, as shown in FIG. 10E.

Using the lift-off method, the photoresist PR is removed. As the photoresist PR is removed, the blue organic emission layer BEML, the blue electron transport layer BETL, and the first cathode electrode CAT1 disposed on the photoresist PR are removed also. As a result, the blue organic emission layer BEML, the blue electron transport layer BETL, and the first cathode electrode CAT1 are kept stacked just on the emitting area of the blue pixel area.

Figure 10F:
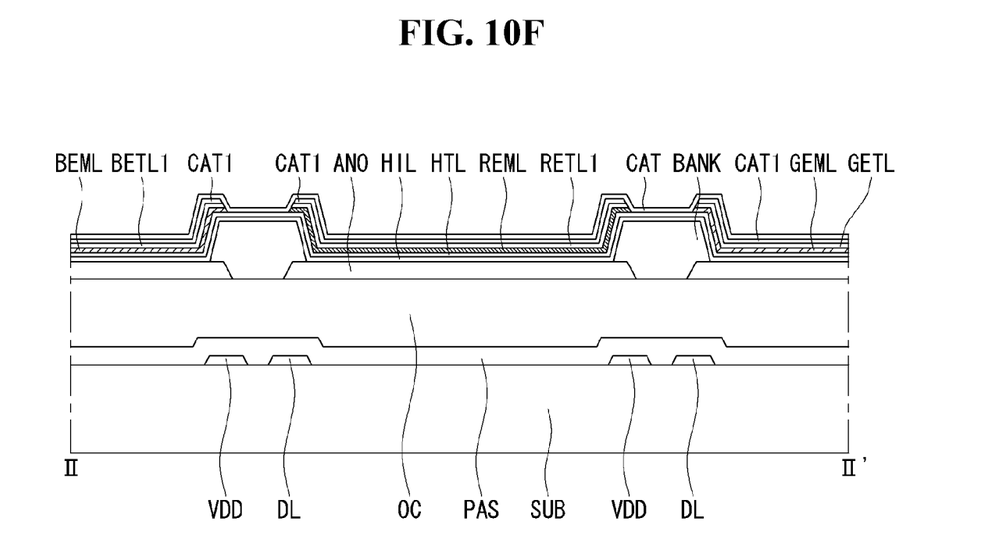

Finally, the red pixels, the green pixels and the blue pixels are completed. Referring now to FIG. 10F, after that, depositing the cathode electrode CAT across the pixel areas on the whole surface of the substrate SUB, the organic light emitting diode OLE is completed. In the present disclosure, when removing or stripping the photoresist PR, the organic emission layers REML, GEML and BEML may not be damaged from any foreign materials because that there are the electron transport layers RETL, GETL and BETL and the first cathode electrode CAT1 are covering each of the organic emission layers REML, GEML and BEML.

Furthermore, in the lift-off process, a strip solvent is used for removing the photoresist, the organic emission layers REML, GEML and BEML may be damaged by the strip solvent. In order to overcome this problem, the photoresist PR may include a highly fluorinated photoresist employing a photodimerization chemistry.

The present disclosure suggests a photolithography process in which organic emitting layer can be patterned uniformly over the large area substrate over 20 inch diagonal size. So, according to the present disclosure, it is possible to manufacture high quality large area organic light emitting diode display with excellent production yield.

While the embodiment of the present invention has been described in detail with reference to the drawings, it will be understood by those skilled in the art that the invention can be implemented in other specific forms without changing the technical spirit or essential features of the invention. Therefore, it should be noted that the forgoing embodiments are merely illustrative in all aspects and are not to be construed as limiting the invention. The scope of the invention is defined by the appended claims rather than the detailed description of the invention. All changes or modifications or their equivalents made within the meanings and scope of the claims should be construed as falling within the scope of the invention.

What is claimed is:

1. A method for manufacturing an organic light emitting diode display having a matrix of pixel areas that includes at least first pixel areas and second pixel areas, the method comprising:
   depositing a photoresist across the first pixel areas and the second pixel areas;
   patterning the photoresist into a patterned photoresist by stripping away first portions of the photoresist in the first pixel areas while keeping second portions of the photoresist in the second pixel areas;
   depositing an organic emission layer across the first pixel areas and the second pixel areas, the organic emission layer deposited over the patterned photoresist in the second pixel areas;
   depositing an electron transport layer across the first pixel areas and the second pixel areas over the organic emission layer; and
   removing portions of the organic emission layer and the electron transport layer in the second pixel areas by stripping away the second portions of the photoresist while keeping portions of the organic emission layer and the electron transport layer in the first pixel areas.

2. The method of claim 1, further comprising:
   depositing a cathode layer across the first pixel areas and the second pixel areas over the organic emission layer,
   wherein portions of the cathode layer in the second pixel areas are removed by stripping away the second portions of the photoresist while keeping portions of the cathode layer in the first pixel areas.

3. The method of claim 1, further comprising:
   after removing portions of the organic emission layer and the electron transport layer, depositing a common electron transport layer across the first pixel areas and the second pixel areas.

4. The method of claim 1, further comprising:
   forming anode electrodes in the first pixel areas and the second pixel areas,
   wherein the photoresist is deposited over the anode electrodes.

5. The method of claim 1, further comprising:
   depositing a common hole injection layer across the first pixel areas and the second pixel areas;
   depositing a common hole transport layer across the first pixel areas and the second pixel areas over the common hole injection layer,
   wherein the photoresist is deposited over the common hole transport layer.

6. The method of claim 1, further comprising:
   after removing portions of the organic emission layer and the electron transport layer, depositing a common cathode layer across the first pixel areas and the second pixel areas.

7. The method of claim 1, wherein the first pixel areas correspond to a first light color and the second pixel areas correspond to one or more second light colors that are different than the first light color.

8. The method of claim 1, wherein depositing the organic emission layer comprises depositing one of a red organic emission layer, a green organic emission layer, or a blue organic emission layer.

9. The method of claim 1, wherein depositing the photoresist comprises depositing a fluorinated photoresist that is subject to photodimerization.

10. The method of claim 1, wherein the patterned photoresist has a reverse tapered shape along edges of the first pixel areas.

* * * * *